US009269836B2

(12) United States Patent
Peil et al.

(10) Patent No.: US 9,269,836 B2
(45) Date of Patent: Feb. 23, 2016

(54) OPTOELECTRONIC CHIP-ON-BOARD MODULE

(71) Applicant: Heraeus Noblelight GmbH, Hanau (DE)

(72) Inventors: Michael Peil, Otzberg (DE); Florin Oswald, Frankfurt am Main (DE); Harald Maiweg, Korschenbroich (DE)

(73) Assignee: Heraeus Noblelight GmbH, Hanau (DE)

( * ) Notice: Subject to any disclaimer, the term of this patent is extended or adjusted under 35 U.S.C. 154(b) by 0 days.

(21) Appl. No.: 14/531,330

(22) Filed: Nov. 3, 2014

(65) Prior Publication Data
US 2015/0048407 A1 Feb. 19, 2015

Related U.S. Application Data

(62) Division of application No. 13/818,868, filed as application No. PCT/EP2011/004326 on Aug. 29, 2011.

(30) Foreign Application Priority Data

Sep. 6, 2010 (DE) .......................... 10 2010 044 471
Jul. 18, 2011 (DE) .......................... 10 2011 107 892

(51) Int. Cl.
*H01L 31/0203* (2014.01)
*H01L 33/54* (2010.01)
(Continued)

(52) U.S. Cl.
CPC .............. *H01L 31/0203* (2013.01); *F21K 9/00* (2013.01); *H01L 21/56* (2013.01);
(Continued)

(58) Field of Classification Search
CPC ........................................................ H01L 33/54
USPC ............................................................ 257/791
See application file for complete search history.

(56) References Cited

U.S. PATENT DOCUMENTS 4,897,027 A    1/1990  Szaplonczay et al.
5,036,024 A *  7/1991  Mine et al. ....................... 29/827
(Continued)

FOREIGN PATENT DOCUMENTS

DE   102008009808 A1   8/2009
DE   102010044470 A1   3/2012
(Continued)

OTHER PUBLICATIONS

Int'l Search Report issued Nov. 8, 2011 in Int'l Application No. PCT/EP2011/004326.
(Continued)

*Primary Examiner* — Lex Malsawma
(74) *Attorney, Agent, or Firm* — Panitch Schwarze Belisario & Nadel LLP

(57) ABSTRACT

A method is proposed for coating an optoelectronic chip-on-board module including a flat substrate populated with one or more optoelectronic components having at least one primary optical arrangement and optionally at least one secondary optical arrangement. The optoelectronic chip-on-board module is coated with a transparent, UV-resistant, and temperature-resistant coating made of silicone by the following steps: (a) casting a liquid silicone into a mold open towards the top and having outer dimensions corresponding to or exceeding outer dimensions of the substrate; (b) inserting the substrate into the mold, wherein the optoelectronic component(s) are immersed completely into the silicone and a surface of the substrate contacts the silicone completely or the substrate immerses into the silicone at least partially with full surface contact; (c) curing and cross-linking the silicone with the optoelectronic component(s) and the substrate; and (d) removing the substrate from the mold with the coating of cured silicone.

5 Claims, 7 Drawing Sheets

(51) Int. Cl.
| | |
|---|---|
| *F21K 99/00* | (2010.01) |
| *H01L 21/56* | (2006.01) |
| *H01L 23/31* | (2006.01) |
| *H05K 3/28* | (2006.01) |
| *H01L 25/13* | (2006.01) |
| *H01L 31/0232* | (2014.01) |
| *H01L 33/50* | (2010.01) |
| *H01L 33/56* | (2010.01) |
| *H01L 33/58* | (2010.01) |
| *F21Y 101/02* | (2006.01) |
| *H01L 25/075* | (2006.01) |
| *H01L 33/60* | (2010.01) |

(52) U.S. Cl.
CPC ........... *H01L 23/3121* (2013.01); *H01L 25/13* (2013.01); *H01L 31/02322* (2013.01); *H01L 31/02325* (2013.01); *H01L 33/507* (2013.01); *H01L 33/54* (2013.01); *H01L 33/56* (2013.01); *H01L 33/58* (2013.01); *H05K 3/284* (2013.01); *F21K 9/90* (2013.01); *F21Y 2101/02* (2013.01); *H01L 25/0753* (2013.01); *H01L 33/60* (2013.01); *H01L 2924/0002* (2013.01); *H01L 2924/1815* (2013.01); *H01L 2933/005* (2013.01); *H05K 2201/0108* (2013.01); *H05K 2201/0162* (2013.01); *H05K 2201/10106* (2013.01); *H05K 2201/10121* (2013.01); *H05K 2201/10151* (2013.01); *H05K 2203/1316* (2013.01)

(56) References Cited

U.S. PATENT DOCUMENTS

| | | | |
|---|---|---|---|
| 5,797,207 A | 8/1998 | Marable et al. | |
| 7,344,902 B2 | 3/2008 | Basin et al. | |
| 7,638,808 B2 | 12/2009 | Owen et al. | |
| 7,819,550 B2 | 10/2010 | Anderson et al. | |
| 8,669,573 B2 | 3/2014 | Medendorp, Jr. | |
| 8,759,123 B2 | 6/2014 | Wada et al. | |
| 2002/0121645 A1* | 9/2002 | Yasukawa et al. | 257/99 |
| 2006/0105485 A1* | 5/2006 | Basin et al. | 438/27 |
| 2007/0045761 A1 | 3/2007 | Basin et al. | |
| 2007/0122073 A1 | 5/2007 | Neyer et al. | |
| 2008/0112162 A1 | 5/2008 | Chan | |
| 2008/0194061 A1* | 8/2008 | Medendorp | 438/118 |
| 2008/0230797 A1 | 9/2008 | Chang et al. | |
| 2009/0108281 A1 | 4/2009 | Keller et al. | |
| 2010/0065983 A1 | 3/2010 | Kawakubo | |
| 2010/0244071 A1* | 9/2010 | Wada et al. | 257/98 |
| 2011/0315191 A1* | 12/2011 | Takanashi et al. | 136/244 |
| 2013/0193592 A1 | 8/2013 | Peil et al. | |

FOREIGN PATENT DOCUMENTS

| | | |
|---|---|---|
| EP | 1657758 A2 | 5/2006 |
| JP | H07-171846 A | 7/1995 |
| JP | 2003-007929 A | 1/2003 |
| JP | 2003-060240 A | 2/2003 |
| JP | 2006-148147 A | 6/2006 |
| JP | 2008-041843 A | 2/2008 |
| JP | 2009-111102 A | 5/2009 |
| JP | 2010-135693 A | 6/2010 |
| JP | 2010-157638 A | 7/2010 |
| JP | 2010-170990 A | 8/2010 |
| WO | 2008152575 A1 | 12/2008 |

OTHER PUBLICATIONS

Office Action issued Aug. 6, 2012 in DE Application No. 10 2010 044 471.5.

Office Action issued Jun. 7, 2011 in DE Application No. 10 2010 044 471.5.

German translation of an Office Action issued Jan. 14, 2014 in JP Application No. 2013-527483.

German translation of an Office Action issued Apr. 21, 2014 in JP Application No. 2013-527483.

German Translation of an Office Action issued Aug. 25, 2014 in JP Application No. 2013-527483.

Office Action issued Mar. 11, 2015 in CN Application No. 201180042727.0.

Office Action issued May 20, 2015 in KR Application No. 10-2013-7005679.

* cited by examiner

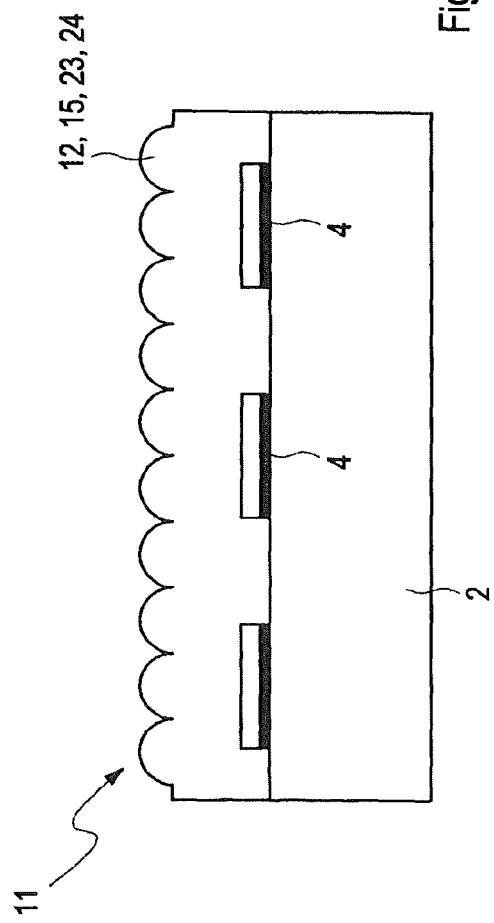
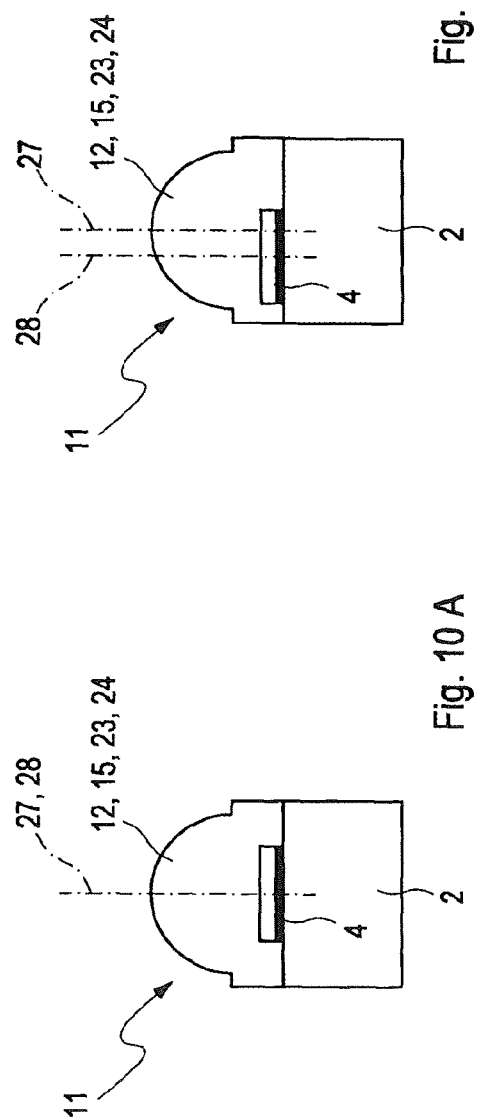

OPTOELECTRONIC CHIP-ON-BOARD MODULE

CROSS-REFERENCE TO RELATED APPLICATIONS

This application is a divisional of co-pending U.S. patent application Ser. No. 13/818,868 filed Feb. 25, 2013, which is a Section 371 International Application No. PCT/EP2011/004326, filed Aug. 29, 2011, which was published in the German language on Mar. 15, 2012, under International Publication No. WO 2012/031703 A1, and the disclosure of which are incorporated herein by reference.

BACKGROUND OF THE INVENTION

The invention relates to a method for coating an optoelectronic chip-on-board module, comprising a flat substrate populated with one or more optoelectronic components, with a transparent, UV-resistant, and temperature-resistant coating made of a silicone, a corresponding optoelectronic chip-on-board module, and a system having multiple optoelectronic chip-on-board modules.

Generic optoelectronic chip-on-board modules are used, for example, as illuminating bodies, as high-power UV LED lamps, as photovoltaic modules, as sensors, or as similar devices. Within the scope of the invention optoelectronic components used in this way include, for example but not exclusively, LEDs or photodiodes in the form of chips or other components arranged in the chip-on-board module on a flat substrate, that is, a metal, ceramic, or silicon substrate, a metal core or FR4 circuit board, a glass substrate, a plastic substrate, or a similar device. These chip-on-board modules must be protected from mechanical damage and corrosion. For this purpose the most compact and lightweight solutions are desired.

From the prior art, light-emitting diode modules having a light-emitting diode array and a micro-lens array are known in various configurations. Examples of such light-emitting diode modules and methods for their production are described, for example, in U.S. Pat. No. 7,638,808 B2, in U.S. patent application publication 2010/0065983 A1, in US 20070045761 A1, or in U.S. Pat. No. 7,819,550 B2. In German published Patent Application No. DE 10 2010 044 470, a method for producing a micro-lens array for an optoelectronic module is also described.

Protection in the form of housings on chip-on-board modules is often expensive and technologically complicated. A practical alternative to the protection of chip-on-board modules is a flat encapsulation of the components with a plastic-based casting material. Together with other functional components, for example strip conductors and contacting elements, the optoelectronic components in chip-on-board modules together with a flat substrate are protected from mechanical damage and corrosion by coatings.

For this purpose, injection molding methods or casting methods with epoxy resins are typically used. These resins are initially applied as liquid casting material and then cured by heat and/or radiation. Because the casting material is initially liquid, the casting material must be prevented from flowing away. This is typically realized by a mold or a fixed frame.

One alternative to these methods is the so-called "dam-and-fill" method, wherein a plastic dam that surrounds an area of the substrate is initially deposited on the substrate of the chip-on-board module. A liquid filling material made of epoxy resin is then filled into this area. This filling material is cured. The dam and filling material together form the coating of the module. For generating the dam, a viscous polymer is applied or drawn with a dispensing device in this method and then cured, so that casting material can be cast onto the area enclosed by the dam, without this casting material flowing away.

The plastic dam generated in this way, however, is not transparent. Therefore, this method of coating negatively affects the light emission intensity or light sensitivity of optoelectronic chip-on-board modules, that is, chip-on-board modules populated at their edges with optoelectronic components, for example LEDs or photodiodes.

These mentioned methods using epoxy resins are less suitable for optoelectronic use, because epoxy resins are not UV-resistant and temperature-resistant. Thus, they are not stable, for example, in a high-power UV-LED module or also under intense sunlight irradiation having UV components, as can occur in photovoltaic systems. They age quickly under UV exposure and are destroyed.

Other transparent, UV-resistant, and temperature-resistant solutions, for example bonding a glass frame or a glass cup, require a very complicated assembly of the frame and a compactness of the frame that can be produced only with difficulty. Such a solution is also associated with a greater weight than a casting solution. For rigid glass materials, a usually necessary adaptation of the thermal expansion coefficients of the compound materials also represents another hurdle, especially if the resulting products are exposed to thermal cycles.

In a combination solution made of a glass frame and an encapsulation with a suitable non-epoxy-based material, e.g., a temperature-resistant and UV-resistant silicone, very small gaps between the frame and substrate can have the result that the silicone, which is strongly susceptible to creep, can run out during the casting. Space for the frame must also be provided on the substrate. This negatively affects a best possible utilization of the substrate surface area and/or a desired stackability.

Due to the necessity for preventing the liquid casting material from flowing away, known injection molding methods and casting methods require a vacuum seal that seals the edge of the module. This results in a loss of usable surface area on the module, because the edge area must be kept free from components.

Up until now, no method for realizing a flat coating for chip-on-board modules has been known in which materials can be used both in the face area and also in the edge area of the casting, which materials are both UV-resistant and also temperature-resistant and that are also transparent for electromagnetic radiation from the ultraviolet to the infrared spectral range.

In European patent application publication EP 1 657 758 A2, a corresponding casting method for LED units on a support structure for generating lenses for the LED units is known in which liquid silicone is filled into a negative mold for the lens structure and the support structure is placed with the LEDs on the mold, so that the LEDs are immersed in the liquid lens material. Around the support structure of the module and the mold, a vacuum seal is applied that acts at the edge of the support structure or the substrate of the module and the mold and presses the two together under a high pressure, in order to prevent the liquid material from coming out. In this way, lenses are shaped around the LEDs, while the surface area between the LEDs remains essentially unwetted from casting material up to creeping material.

With this method it is not possible to provide optoelectronic chip-on-board modules with a coating that is transparent, UV-resistant, and temperature-resistant and that can be populated arbitrarily with optoelectronic components, especially while utilizing the entire surface area.

BRIEF SUMMARY OF THE INVENTION

For the use of chip-on-board technology for producing high-power UV-LED modules that emit a two-dimensional pattern or photodiode arrays, a flat casting is advantageous that avoids the mentioned disadvantages. For reasons of optical efficiency and best possible stackability of modules, the casting should be transparent both in the face and also in the edge areas. Likewise, high temperature resistance and UV resistance are relevant both for the production of corresponding optoelectronic components and also for long-term stable functionality.

In light of the prior art, the present invention is based on the object of providing a method for producing an optoelectronic chip-on-board module and a corresponding optoelectronic chip-on-board module, in which a transparent, UV-resistant, and temperature-resistant coating on the entire surface area of the substrate is possible and the entire substrate surface area is available for the placement of optoelectronic components.

This object is achieved by a method for coating an optoelectronic chip-on-board module, comprising a flat substrate populated with one or more optoelectronic components, with a transparent, UV-resistant, and temperature-resistant coating made of a silicone, including the following processing steps:

a) casting a liquid silicone in a mold open towards the top and having outer dimensions that correspond to or exceed the outer dimensions of the substrate, b) introducing the substrate into the mold, whereby the optoelectronic component or the optoelectronic components are immersed completely into the silicone and a surface of the substrate contacts the silicone completely or the substrate immerses into the silicone in at least partially full surface contact, c) curing and cross-linking the silicone with the optoelectronic components and the substrate, and d) removing the substrate from the mold with the coating made of the cured silicone.

In contrast to the prior art according to EP 1 657 758 A2, the coating applied on the optoelectronic chip-on-board module as a result of the method is present up to the edge and optionally over the edge of the substrate in a thickness sufficient for corrosion protection and mechanical protection. This coating is transparent, UV-resistant, and temperature-resistant on the entire coated surface area of the substrate. Since the coating is up to the edge of the substrate and beyond, it is possible to arrange the optoelectronic components arbitrarily on the substrate. Because a vacuum seal does not need to be applied running around the substrate and the corresponding mold, and therefore no edge is produced that must remain free from optoelectronic components, an optimal utilization of the surface area is possible.

The method according to the invention takes advantage of the creepage properties of the silicone, because they guarantee efficient wetting and thus an efficient protection of the substrate of the optoelectronic components arranged on this substrate and other add-on parts and components. In the method according to the invention, liquid silicone is cast into the mold in which the substrate is then inserted headfirst. The filling height of the silicone is here selected such that, with its surface, the substrate just contacts or is immersed in the surface of the silicone. The liquid silicone is then cross-linked thermally, for example, together with the mold and the substrate. Alternatively or additionally, radiation cross-linking can also take place. When the silicone is completely cured, the substrate, including the now cured, bonded, and transparent casting is removed from the mold. In this way, a UV-resistant and temperature-resistant protection of chip-on-board modules is produced up to intensities of several 10 $W/cm^2$ or even of several 100 $W/cm^2$ and approx. 200° C. This protection is transparent and uniform over the entire face and edge areas and also offers a mechanical protection of the substrate and the add-on parts.

Preferably, the process steps a) and/or b) and/or c) and/or d) are performed under an elevated atmospheric pressure, especially at an atmospheric pressure between 4 and 10 bar, especially between 5 and 7 bar. The elevated atmospheric pressure, which is not a mechanical pressure of the substrate relative to the mold, has the result that gas bubbles are reduced in the silicone mass until they close completely and the gas is diffused outward through the silicone mass.

In addition, it is preferably provided to expose the silicone to a vacuum, for example at approx. 10 mbar, before the filling, in order to enable gas inclusions to outgas. This produces a gas-free silicone material that can then be filled into the mold.

If optically functional materials, especially phosphorescing and/or dispersing materials or particles, are or become mixed into the liquid silicone, the optical properties of the optoelectronic chip-on-board modules can be further changed. In this way, a wavelength shift and a color change of the emitted light can be realized by the phosphorescing materials, while dispersing materials or particles cause a homogenization of the emitted light.

Preferably, a surface structure that is given by the mold or is added later is generated on a surface of the coating. This structure involves, for example, raised or recessed sections on the surface of the casting of the finished module, which are shaped for example inverse from the mold. In this way, macroscopic and microscopic primary optical arrangements or general surface structures, for example lenses, especially micro-lenses, or light-scattering roughened sections, can be applied directly onto the module.

Advantageously, the substrate is or will be populated with optoelectronic components up to one or more edges. In this way, the existing substrate surface area is optimally used. This also has the advantage that systems made of several chip-on-board modules arranged one next to the other allow a uniform arrangement of the optoelectronic components even beyond the boundaries between the substrates over a large surface area. The at least one optoelectronic component can have, for example, one or more photodiodes and/or one or more light-emitting diodes (LEDs). In particular, the substrate can be populated with optoelectronic components such that a photodiode array and/or a light-emitting diode array is produced.

Advantageously, the substrate is coated without a margin and/or over the edge. In this way, a coating without a margin guarantees full design freedom, while a coating that goes beyond the edge and thus encloses the side faces of the substrate completely or partially, also prevents discontinuities or foreign matter from penetrating into the gap between the coating and the surface of the substrate.

The method according to the invention and its embodiments thus provide, in addition to the advantage that a full surface-area UV-resistant and temperature-resistant, transparent coating of the substrate is made possible, also the additional advantages that the design freedom of the arrangement of the optoelectronic components on the substrate is maximized, and due to the transparent edge, the possibilities for seamless stacking of chip-on-board modules one on top of the other is improved.

The method can be used to selectively set the optical functions by surface shaping and by mixing optical functional materials into the casting material. The hardness of the silicone can be selected so that thermally induced stresses, which occur due to different coefficients of expansion between the substrate, chip-on-board components, and connecting materials, are damped. Typical Shore hardness values here lie between the hardness of a gel and a Shore hardness close to 100.

The method can be performed especially such that the silicone is shaped in such a way that at least one optical component, especially at least one lens and/or at least one lens array, for example at least one micro-lens and/or at least one micro-lens array, is formed in the silicone. This can be realized, for example, such that through a corresponding shaping of the mold, a corresponding shape is impressed on the silicone during and/or after the curing and cross-linking, for example in the form of a surface structure that imparts the corresponding effect of the at least one optical component on the surface of the silicone.

Furthermore, a damping of thermally induced stresses in the optoelectronic module or parts of the module can be achieved through a suitable structuring of the mold. Such thermally induced stresses can occur especially in a curing process or through temperature changes due to the operation of the module, for example the array. For damping these thermally induced stresses, for example, a targeted structuring of the mold, also designated as a casting form, can also be used, for example in some sections by thin silicone layers between optically active thicker silicone layers. The latter possibility is similar, for example, to the known expansion joint principle in roadwork engineering.

The method can be performed such that the chip-on-board module has at least one primary optical arrangement adjacent to the at least one optoelectronic component and optionally at least one secondary optical arrangement, wherein at least one optical arrangement selected from the group consisting of the primary optical arrangement and the secondary optical arrangement is formed in the silicone.

In the scope of the present invention, an optical arrangement is here generally understood to be an element that has a focusing and/or collimating and/or scattering effect on a light beam. The optical arrangement, especially the primary optical arrangement and/or the secondary optical arrangement, can have, for example, at least one optical element selected from the group consisting of a lens, a reflector, a diffuser, an optical grating, a hologram. Combinations of the mentioned and/or other optical elements are also conceivable.

For example, an optical arrangement can have at least one focusing lens and/or at least one scattering lens and/or at least one reflector, for example a mirror, with focusing or scattering effect and/or at least one diffuser. Combinations of the mentioned effects and/or structures are also conceivable. For example, a focusing lens can have a rough surface, so that the light is indeed collimated, but on smaller local areas the light scatters and thus is, for example, mixed. For larger lens structures that can be arranged, for example, over multiple optical components and can comprise, for example, multiple LEDs, segment-by-segment combinations of locally scattering and focusing areas are also conceivable.

A focusing optical arrangement can also be formed completely or partially as a convex optical arrangement. A scattering optical arrangement can be formed, for example, completely or partially as a concave optical arrangement. For example, a focusing lens can be a convex lens and a scattering lens can be a concave lens.

Furthermore, alternatively or additionally, a function of a diffuser can also be provided. For this purpose, for example, one or more regular or irregular structures can be provided, especially in tight spaces having dimensions, for example, in the sub-millimeter range and typically in the range of micrometers, in which, for example, variations between concave and convex shapes can be realized, especially in the form of a rough profile.

As an alternative or addition to one, more, or all of the already mentioned optical elements, the optical arrangement, especially the primary optical arrangement and/or the secondary optical arrangement, can also comprise other types of diffraction structures. Especially for optoelectronic components in the form of diode lasers, however also for other types of optoelectronic components, the optical arrangement, especially the primary optical arrangement and/or the secondary optical arrangement, can also comprise one or more diffractive optical elements that can have a light-diffraction effect, for example amplitude and/or phase grating structures that can be structured, for example, on the scale of the wavelength of the light, as for example diffraction patterns in transmission or reflection, phase gratings in transmission or reflection, volume holograms or combinations of the mentioned and/or other diffractive optical elements. Such diffractive optical elements can be used as optical elements of the primary optical arrangement and/or the secondary optical arrangement, for example for optoelectronic components in the form of narrow-band, monochromatic light sources.

If the optical arrangement, especially the primary optical arrangement and/or the secondary optical arrangement, comprises at least one reflector, then the reflector can be formed in different ways. In particular, different reflector profiles, that is, reflector geometries and/or reflector profiles, can be used. For example, a reflector can have, especially in an intersecting plane parallel to an optical axis of the reflector, at least in some sections, at least one profile selected from the group consisting of: a straight profile, a parabolic profile, an elliptical profile, a profile of a conical section, a freeform profile, a trapezoidal profile.

Accordingly, a primary optical arrangement is understood to be an optical arrangement directly adjacent to the at least one optoelectronic component, so that light emerging from the optoelectronic component enters directly into the primary optical arrangement or so that light entering into the optical component passes the primary optical arrangement directly before entrance into the optoelectronic component. For example, the primary optical arrangement can have one or more lenses, especially micro-lenses that are formed, for example, in the silicone and/or a coating comprising the silicone and that are placed directly on the at least one optoelectronic component or in which the optoelectronic component is completely or partially embedded. Alternatively or additionally, the primary optical arrangement can have one or more reflectors, on which the light coming out from the optoelectronic component is reflected and here focused or scattered or on which the light coming into the optoelectronic component is focused or scattered or deflected in some other way.

The term "the primary optical arrangement" thus characterizes at least one beam-shaping element adjacent to the optoelectronic component on a light path, without additional optical components being arranged between the primary optical arrangement and the optoelectronic component, wherein the term "the primary optical arrangement" is used independent of whether additional optical arrangements, especially a secondary optical arrangement, are present or not.

Accordingly, a secondary optical arrangement is understood to be an optical arrangement arranged in the optoelectronic chip-on-board module, such that the light on a light path between the secondary optical arrangement and the at least one optoelectronic component must pass at least one additional optical arrangement. Thus, for example, light coming from the optoelectronic component can first pass a primary optical arrangement, before the light passes a secondary optical arrangement. Alternatively, light entering into the optoelectronic component can first pass the secondary optical arrangement, then the primary optical arrangement, before the light finally enters into the optoelectronic component.

The at least one primary optional optical arrangement can have, for example, at least one lens, especially a plurality of lenses, especially micro-lenses. For example, the optoelectronic chip-on-board module can have a plurality of optoelectronic components arranged in a matrix and/or an array, for example a light-emitting diode array and/or a photodiode array. A plurality of elements of a primary optical arrangement can be allocated to this plurality of optoelectronic components, such that, for example, exactly one component of the primary optical arrangement and/or a defined group of components of the primary optical arrangement is allocated to each optoelectronic component or group of optoelectronic components. Thus, for example, exactly one lens can sit on each optoelectronic component, or a common lens for a group of optoelectronic components can sit on this group.

The at least one optional secondary optical arrangement can have, for example, at least one reflector and/or at least one lens. For example, elements of the secondary optical arrangement can be allocated in turn to optoelectronic components, for example, one or more elements of the secondary optical arrangement can be allocated in turn to each element or group of elements of an array of the optoelectronic components. For example, the secondary optical arrangement can comprise a plurality of reflectors, for example a plurality of concave mirrors, which can be arranged, for example, in a matrix and/or an array. An optoelectronic component and/or a group of optoelectronic components can be allocated to each concave mirror, for example, by arranging the optoelectronic component completely or partially within the concave mirror.

In general, the method can also be performed such that the primary optical arrangement and the secondary optical arrangement are produced completely or partially from different materials, for example different silicones of the described type. In particular, the primary optical arrangement and the secondary optical arrangement can be produced completely or partially from materials, for example by successive casting methods of the described type that have different refractive indices. For example, the primary optical arrangement can be produced completely or partially using a silicone having a first refractive index $n1$, and the secondary optical arrangement can be produced completely or partially using a silicone having a second refractive index $n2$.

For example, in this way an optoelectronic chip-on-board module can be produced that has a primary optical arrangement, for example a primary optical lens array, with material $n1$ and also a secondary optical arrangement, which can have, for example, a combination made of at least one reflector and at least one silicone lens, wherein, for example, the silicone lens can be formed between the adjacent sides of the reflector. The silicone lens of the secondary optical arrangement can be produced, for example, from a second casting material having a refractive index $n2$, wherein $n1$ can be not equal to $n2$. In general, the primary optical arrangement and/or the secondary optical arrangement can be produced according to the invention.

The object forming the basis of the invention is also achieved by an optoelectronic chip-on-board module comprising a flat substrate populated with one or more optoelectronic components, with a transparent, UV-resistant, and temperature-resistant coating made of a silicone, characterized in that a surface of the substrate populated with one or more optoelectronic components is coated with the silicone without margins.

This optoelectronic chip-on-board module according to the invention has the same advantages as the method according to the invention described above, because it is coated without margins with a silicone that is transparent, UV-resistant, and temperature-resistant. The entire surface of the substrate is available for the arrangement of optoelectronic components, so that the design freedom is maximized.

Preferably, the substrate is coated at least partially with the silicone also on its side faces, so that the protection of the chip-on-board module is further increased.

In one advantageous embodiment, the silicone has a mixture of optically functional materials, especially phosphorescing and/or scattering materials or particles. This allows the wavelengths and color properties of the material to be adjusted, especially if the optoelectronic chip-on-board modules are light-generating modules, for example LED modules and/or UV-LED modules.

Likewise advantageously, the coating also preferably has a surface structure, especially lenses, preferably micro-lenses, or light-scattering roughened sections. This surface structure can be generated by shaping from the mold or by later processing.

In another alternative or additional construction that can be realized, the coating has at least one optical component. With respect to possible constructions of the optical component, the above description can be referenced. In particular, one or more optical elements can be included, for example as primary optical and/or secondary optical elements having at least one effect selected from the group consisting of a focusing effect, a scattering effect, a diffusive effect, and a deflecting effect. For example, one or more optical elements can be included as primary optical and/or secondary optical elements selected from the group consisting of a focusing lens, especially a convex lens, a scattering lens, especially a concave lens, a reflector, a diffuser, an optical grating, a hologram. Combinations of the mentioned and/or other optical elements can also be included. In particular, one or more of the mentioned optical elements can be arranged as an array. For example, the coating can have at least one array that contains several of the mentioned optical elements of the same or different type. The array can be generated in the scope of the present invention in the form of a surface structure by shaping from the mold. In particular, the coating can have at least one lens and/or at least one lens array.

For example, the coating can comprise at least one lens array. This lens array can comprise several lenses whose dimensions can be adapted to the corresponding use. Thus, lenses can be included that have, in their diameter or equivalent diameter in a top view of the substrate, dimensions that can equal from several micrometers or a hundred micrometers up to decimeters. In particular, the lens array can be shaped completely or partially as micro-lens arrays and can comprise one or more micro-lenses, for example having dimensions in the sub-millimeter range. In general, the optical arrangement can comprise, for example, at least one micro-optical element and/or at least one micro-optical arrangement. As discussed above, the dimensioning of the optical arrangement and/or the optical elements generally can be adapted to the use. For example, one or more optical elements can be included, for example one or more lenses, especially within a lens array having a diameter that is typical for optoelectronic components, for example LEDs of 1-10 mm, in particular a diameter of 2-4 mm. Thus, for example, typical high-power LEDs have an emission area of 1 mm$^2$, which can be covered completely or partially with the mentioned dimensions of the optical elements.

The optical arrangement, especially of one or more optical elements of the primary optical arrangement and/or the secondary optical arrangement, can have changes in curvature, especially on local areas or sub-areas, for example on a scale in the sub-millimeter range. In this sub-millimeter scale, the optical arrangement can thus influence locally adjacent beam paths of parallel light. Thus, for example, curvature structures having equivalent local radii in the sub-millimeter range can be used as one or more optically effective elements of the primary optical arrangement and/or the secondary optical arrangement.

As discussed above in the scope of the description of the method, the chip-on-board module can have at least one primary optical arrangement and optionally at least one secondary optical arrangement adjacent to the at least one optoelectronic component. At least one optical arrangement selected from the group consisting of the primary optical arrangement and the secondary optical arrangement can be formed at least partially in the coating, especially in a surface structure of the coating.

As discussed above, the at least one coating, for example the first coating and/or the second coating, can comprise in particular at least one silicone. The coating and the optoelectronic chip-on-board module can be produced or coated, in particular, by a method according to the invention. In general, the primary optical arrangement and the optional secondary optical arrangement can be formed in the same at least one coating. Alternatively, the primary optical arrangement can also be formed in at least one first coating and the secondary optical arrangement can be formed completely or partially in at least one second coating, which can be different from the first coating. In particular, the primary optical arrangement and the optional secondary optical arrangement can also be formed using different coatings having different refractive indices. For example, as described above, the primary optical arrangement can be arranged completely or partially in at least one first coating, for example a first silicone coating having a first refractive index n1, and the secondary optical arrangement can be formed completely or partially in at least one second coating, which can have a second refractive index n2≠n1. The coatings can be applied one after the other, for example in different coating steps, wherein, for example, one or two of the coatings can be applied on the optoelectronic chip-on-board module using a coating method according to the invention.

For other possible constructions of the primary optical arrangement and/or the secondary optical arrangement, which can be formed individually or both completely or partially in the coating, reference can be made to the above description of the method.

Preferably, the substrate is populated with optoelectronic components up to one edge or up to shortly before one edge. This also includes the possibility that the substrate is populated with optoelectronic components up to several or all of the edges or up to shortly before these edges. This allows the effective utilization of the entire available surface area of the substrate, since the edge does not have to be left free, because a vacuum seal, as is known from the prior art, is eliminated.

Here, a constant pitch of optoelectronic components can also be maintained across the boundaries between adjacent modules.

The optoelectronic chip-on-board module according to the invention is produced or can be produced preferably according to a method according to the invention as described above.

Further, the object forming the basis of the invention is also achieved by a system having two or more optoelectronic chip-on-board modules described above, wherein the substrate and the optoelectronic chip-on-board modules are arranged flush or with a defined spacing relative to each other, wherein especially due to optoelectronic components being populated on the substrate up to the edges, a regular arrangement and spacing of optoelectronic components even across the boundaries between adjacent substrates is realized. A defined spacing is here generally understood to be a selected, fixed, and usually constant spacing dependent on location between two adjacent modules. This must be selected, for example, for the consideration of material tolerances, in order to guarantee manufacturability or to achieve certain lengths of the system, for example a lamp.

The properties, features, and advantages mentioned for the subject matter of the invention, that is, the method according to the invention, the optoelectronic chip-on-board module according to the invention, and the system according to the invention, apply without restriction also for the other subject matter of the invention.

The proposed method, the optoelectronic chip-on-board module, and the system can be used advantageously in numerous ways. For example, irradiation devices having high radiation intensity can be realized in this way in chip-on-board technology. From the prior art, due to the typically necessary small spacings between the LEDs (so-called pitch), only a few methods are known with which mainly beam-shaping micro-lenses can be realized above the individual LEDs of an LED array by a casting material. Likewise, the selected influencing by a position-dependent adaption of the emission characteristics of the individual micro-lenses (optical arrangement) in an array arrangement in front of the LED emitter and also in the margin area is practically impossible with previous methods. By the proposed method, such add-on parts, however, are possible without a problem. In particular, micro-lens primary optical arrangements and/or micro-lens secondary optical arrangements can be realized for LED arrays, wherein the secondary optical arrangements can be optimally adapted to the primary optical arrangements and/or vice versa. Linking this primary optical arrangement header and one or more secondary optical arrangements opens up new concepts for increasing the radiation intensity in significant working spacings of >10 mm with respect to the light output window of the LED emitter.

The proposed method makes possible, in particular, an individual shaping of individual lenses, in particular micro-lenses, across one, more, or all of the optoelectronic components, especially the LEDs of an LED array configuration. In this way, for example, emission characteristics of an entire LED array can be selectively influenced, for example for the purpose of homogenization and/or beam focusing.

As discussed above, the proposed method can be used especially for the production of optoelectronic chip-on-board modules and systems that have at least one primary optical arrangement and optionally at least one secondary optical arrangement. Here, the primary optical arrangement and/or the secondary optical arrangement can be produced completely or partially according to the invention, in which the primary optical arrangement and/or the secondary optical arrangement is formed in the silicone or the coating.

Systems having primary optical arrangements and secondary optical arrangements are known in concept from the prior art from different areas and can now be realized and produced according to the invention. For example, the use of secondary optical arrangements for already packaged LEDs (e.g., LEDs in an SMD housing) is basically known. Furthermore, LEDs are used (assembled) in reflector housings and housings are enclosed with an encapsulating material that has optical properties for beam shaping, e.g., the shaping of the encapsulating material into lenses. Such housings are to some degree already available on the market. In most enclosed LED products, however, the optical functionality of the housing includes only a beam-shaping optical variant, either a reflector realized by a recess in which the LED is inserted, or a lens, wherein the LED is then usually placed on a flat substrate. For these components, if necessary, another secondary optical arrangement (lens or reflector, or a combination of the two) is placed over the enclosed LEDs. For LED arrays, the use of micro-reflectors is described in U.S. Pat. No. 7,638,808. Here, a substrate is used that has cavities in which LEDs are inserted. Side walls of these individual cavities are used as reflectors that can be adaptively shaped. Also described is the use of an additional beam-forming encapsulation in which the cavities are closed. This thus involves a combination of primary micro-lenses and primary micro-reflectors, for individual LEDs in an array arrangement. Such known concepts, which can be realized only in a comparatively complicated way with conventional methods, can be realized easily and reliably with the method proposed according to the invention.

Furthermore, according to the invention, concepts having primary optical arrangements and secondary optical arrangements can be realized in which one or more secondary optical arrangements can be used that further focus the light, for example for several light-emitting diodes each having associated micro-primary optical arrangements. These optical arrangements can be placed, for example, on LED arrays, segments of LED arrays, photodiode arrays, or segments of photodiode arrays, so that, for example, a secondary optical arrangement of several LEDs of one LED array includes micro-optics.

The invention can be used especially in the fields of irradiation and illumination technology, for example in industrial processes. In industrial processes there are a multitude of LED illumination and irradiation applications, especially in the ultraviolet and infrared spectral range. Numerous examples are to be mentioned here, for example, the drying of inks, an application for irradiation in the field of UV curing, for example of adhesives, inks, dyes, paints, and encapsulation materials, as well as use in illumination applications.

In particular, by the present invention, the typical requirements for irradiation applications can be easily realized. The basic requirements are here usually that, in the wavelength range being used, a high irradiation strength or an irradiation strength adapted to the corresponding application, wherein typically irradiation strengths of several 10 $\mu W/cm^2$ up to several ten or a few hundred $W/cm^2$ can be realized in an adjustable distance of typically a few millimeters up to one meter or more. Simultaneously, typically defined light distributions required for each process can be achieved. The light distribution can here be, for example, a homogeneous field distribution in a certain processing window or a narrow line. Thus, for example, current applications in the printing industry are the fields of inkjet, sheet offset, screen printing, gravure printing, and flexographic printing methods. Sheet printing methods usually require high irradiation strengths of 2-20 $W/cm^2$ at distances of 20-200 mm for ultraviolet LED light in the range of 360-420 nm.

The minimum requirement on the irradiation strength necessary for each process is also usually dependent on material. For example, for UV curing applications, usually photo-initiators are used that enable a sufficiently quick reaction for cross-linking the monomers (polymerization) usually only when the irradiation strength exceeds a threshold, so that a good curing result is achieved. Here, for example, during surface curing, an inhibition by oxygen also acts against the polymerization.

The basis for an efficient realization of high-power LED emitters that can have a plurality of LED chips and that can have optical powers of a few W up to several 10 kW and that usually must also satisfy special requirements on the corresponding illumination profiles, is the highest possible efficient light output from a minimum required emission surface. Efficient and compact emitters have emission surfaces of several $cm^2$ up to a few hundred $cm^2$. To achieve the packaging densities required for this process of, for example, up to 20 pieces of 1 $mm^2$ large LED chips/$cm^2$, and that can keep large incoming thermal loads as low as possible due to the typical efficiency values of UV LEDs in the field of 1-50%, optoelectronic chip-on-board modules according to the invention and systems according to the invention can be easily inserted with several optoelectronic chip-on-board modules. For example, currently chip-on-board modules are being developed having optoelectronic components in the form of chips having a surface area of 1.3×1.3 $mm^2$. Future developments can expect modules having chips of up to several $mm^2$ chip surface area.

Light emitted by light-emitting diodes is usually divergent due to typical LED emission characteristics. Modern LEDs are typically surface emitters that emit into half-space and usually have the emission characteristics of a Lambert emitter. These divergent emission characteristics produce a strong dependency of the irradiation strength on the work distance, that is, in the distance between the object to be irradiated and the optoelectronic chip-on-board module, especially the LED emitter. According to the invention, however, the emitted light from LEDs in an LED array configuration can be used more efficiently, and a high irradiation strength can be realized even at large work distances. In particular, adapted optical arrangements can be realized that can maximize, for one, the decoupling of the light from the optoelectronic chip-on-board modules, especially the LED-Chips, and can generate, for another, a high irradiation strength and a defined field distribution at a certain work distance.

For very large work distances, for example work distances of at least 20 mm, in particular, the emitted light can be greatly collimated. The use of a primary optical arrangement without additional optical arrangements, however, usually bumps up against limits, because the LED cannot be viewed as a point light source in the case of micro-lens optics. This is especially dependent on the fact that the size of the lens, which typically has a diameter of 1-10 mm, and the size of the LED, which typically has an edge length of 1 mm, are comparable. Therefore, the light usually cannot be completely collimated, and with increasing collimation the efficiency of the lens also decreases due to reflection losses in the lens. For an optimized solution, therefore, for example in addition to at least one optimized primary optical arrangement, for very high requirements on the irradiation strength and on the work distance, according to the invention at least one additional secondary optical arrangement can be realized, in order to achieve high collimation or even focusing of the light and to maximize the system efficiency.

In particular, at least one secondary optical arrangement can be realized in the form of a reflector optical arrangement having at least one reflector or in the form of one combination of at least one reflector optical arrangement and at least one lens optical arrangement. In this combination, the light that cannot be guided directly through the primary optical arrangement into the irradiation field can be, for example, "focused" by the reflector and deflected into an irradiation field. Furthermore, in one implementation according to the invention, a primary optical arrangement can be optimized to a secondary optical arrangement and vice versa, so that a two-sided adaption of the primary and secondary optical arrangements is possible.

According to the invention, especially for influencing directional characteristics, especially emission characteristics of the light emitted by the LEDs, at least one optical system can be used. Accordingly, as discussed above, the optoelectronic chip-on-board module according to the invention and/or the system according to the invention can have at least one optical system. For the use of several optical arrangements, a distinction can be made, as discussed above, between primary and secondary optical arrangements. For example, the primary optical arrangement can comprise a lens array made of a transparent encapsulation material that can be applied, for example, by a method according to the invention, directly on the substrate populated with the optoelectronic components, for example the LEDs, so that the primary optical arrangement can be connected, for example, rigidly to the LED chips. For example, for UV LEDs, a UV-resistant, thermally cured silicone can be used, wherein alternatively or additionally, a use of other materials is also conceivable, for example the use of light curing acrylate, PMMA, polycarbonate, or other materials or of combinations of the materials mentioned and/or other materials. As discussed above, the term "primary optical arrangement" is used independent of whether this primary optical arrangement is combined with other optics or not.

According to the invention, numerous optically functional geometries can be realized, for example lens shapes and/or scattering shapes. These geometries can be adapted to the irradiation strength profiles required for the applications. Only shapes having significant undercuts are usually difficult to realize, because the method according to the invention involves a casting method. Shapes that can be easily realized, however, include: spherical lens optics, especially in the form of cylindrical and/or rotationally symmetric optical arrangements, both symmetrical and also asymmetrical shapes; aspherical optical arrangements, especially in the form of cylindrical and/or rotationally symmetric optical arrangements, both symmetrical and also asymmetrical shapes; free-form optics, especially in the form of cylindrical and/or rotationally symmetric optical arrangements, both symmetrical and also asymmetrical shapes; Fresnel optics, especially in the form of cylindrical and/or rotationally symmetric optical arrangements, both symmetric and also asymmetric shapes; polygonal and/or facetted optical arrangements, especially in the form of cylindrical and/or rotationally symmetric optical arrangements, both symmetric and also asymmetric shapes; rough structures, for example for light scattering or for statistically distributed light diffraction; structures having structured surfaces. Combinations of the mentioned shapes and/or other shapes are also possible.

The possibility for realizing a primary optical arrangement offers several features and advantages. For example, especially at least one lens can be positioned directly over one optoelectronic component, for example directly over one LED. In this way, in contrast to a lens in the typical sense, the lens has only one output side and no input side, because the light emerging from the LED can enter directly into the material of the lens. This leads to an increase in the decoupling efficiency of the light from the LED or from the system, because the light must pass fewer boundary surfaces, and the adaption of the refractive index between the LED and encapsulation leads to a reduction of the internal total reflection within the LED, but also in comparison to the total reflection for a flat encapsulation.

Through the geometry of the lens, reflection losses at the boundary surface between the encapsulation and air can also be selectively minimized. This further increases the efficiency, for example in comparison to a flat encapsulation. For silicone, usually an increase in the decoupling efficiency of approximately a factor of 2 is possible relative to a flat encapsulation.

For each individual optoelectronic component, for example for each individual LED, beam shaping adapted to the specific requirements can be generated, so that the geometry of the optics, for example the lens geometry, can be optimized both under consideration of the direct deflection of the light onto the target irradiation surface, and also with respect to the decoupling efficiency and also to the adaption to the properties of a secondary optical arrangement.

Viewed spatially, the lens faces can also be arranged very close, for example at a distance of less than 1 mm, to the optoelectronic components, for example the LEDs. In this way, for example, the light of a large range of the spatial angle, especially up to a spatial angle range of more than 70°, can be used, which increases the efficiency and can enable high power densities.

The encapsulation or the coating, especially the silicone encapsulation, protects the optoelectronic components, especially the LEDs, furthermore from external influences such as foreign matter, moisture, and mechanical influences.

Furthermore, the encapsulation material usually has a higher refractive index than air. Thus, the refractive index of the encapsulation material is typically n>1, for example n=1.3-1.6. Thus, usually there is a refractive index adjustment between the semiconductor material of the optoelectronic components, especially the LED chips, whose refractive index is typically n=3-4, and the encapsulation material. In this way, the light decoupling from the optoelectronic chip-on-board module is improved and the overall efficiency is positively influenced.

As an alternative or addition to the use of one or more lenses in the primary optical arrangement, the primary optical arrangement can also have one or more reflectors. Thus, the primary optical arrangement can have, for example, a micro-reflector array in which, for example, each optoelectronic component, for example each LED, can be arranged in a small cavity whose reflective walls form the micro-reflector. An array-primary optical arrangement comprising a combination of at least one micro-lens and at least one micro-reflector is also possible.

The at least one optional secondary optical arrangement can also be realized analogously, for example, in the form of one or more refractive elements, for example one or more lens elements, and/or in the form of one or more reflective elements.

Depending on the application process, the requirements on the emitted light can also vary. For example, if an arrangement made of substrates or carriers is used in a continuous operation process, then it is usually important to realize a homogeneous and intensive irradiation strength perpendicular to the direction of travel, while a maximum dosing power is usually important in the direction of travel. In actual steps this means that, for example in the case of a line emitter, it can be advantageous to position the LEDs very closely in one spatial direction, for example with a spacing of 0.05-5 mm, next to each other, while in the spatial direction orthogonal to this first direction, it is more meaningful to increase the distance between the LEDs, for example to more than 1 mm, in order to maintain space in this way, for example, for an efficiently focusing primary and/or secondary optical arrangement. In contrast, a uniform distribution of the optoelectronic components, for example a uniform LED distribution, can be favorable usually for realizing a two-dimensional emitter that is to provide a homogeneous, two-dimensional illumination.

In general, according to the invention, equal geometries or different geometries or even geometries that change depending on the position can be realized. For example, there can be spacings between the optoelectronic components, for example the LEDs, and/or the micro-lenses in one or two spatial directions within an array. Thus, a distribution of the optoelectronic components and/or a distribution of the elements of the primary optical arrangement and/or the secondary optical arrangement, for example a micro-lens distribution, can be considered and used in the development of an efficient component, for example an efficient LED emitter.

Furthermore, a structural size of the primary optical arrangement and/or the secondary optical arrangement, for example a structural size of the lenses of the primary optical arrangement and/or the secondary optical arrangement, can be adapted variably, for example to the corresponding application. Here, different possibilities can be realized individually or in any combination. Thus, the optoelectronic components, for example the LEDs, and components of the primary optical arrangement and/or the secondary optical arrangement, for example the lenses, can have comparable structural sizes. This can mean, for example, that each optoelectronic component, for example each LED, has an associated element of the primary optical arrangement and/or the secondary optical arrangement, for example an associated lens. The maximum structural size of the elements of the primary optical arrangement or the secondary optical arrangement, for example the maximum structural size of each lens, is here usually limited by the pitch of the optoelectronic components, for example the LEDs.

Furthermore, alternatively or additional, embodiments can also be realized in which the structural size of individual, multiple, or all of the optoelectronic components is smaller than the structural size of the optics, for example of the primary optical arrangement. For example, embodiments can be realized in which the structural size of the LEDs is smaller than that of the associated lenses. This can then mean, for example, that a lens and/or another component of the primary optical arrangement and/or the secondary optical arrangement can extend over multiple optoelectronic components, for example over multiple LEDs.

Furthermore, alternatively or additionally, embodiments can also be realized in which the structural size of individual, multiple, or all of the optoelectronic components is larger than the structural size of the optical arrangements, for example the primary optical arrangement. For example, embodiments can be realized in which the structural size of the LED is greater than that of the lens. This can mean, for example, that several elements of the primary optical arrangement and/or the secondary optical arrangement, for example several lenses or a lens array, could be located in front of an optoelectronic component, for example in front of an LED.

Furthermore, within one array, the relationships of the structural sizes of the optoelectronic components and/or the optics can vary in one or two spatial directions. Thus, the relationships can be equal or different in two spatial directions or can also change.

As discussed above, the optical arrangement can have scattering and/or collimating and/or focusing features. Thus, for example, a lens feature could be provided for the primary optical arrangement that is designed to have a scattering, collimating, or focusing design. If only one primary optical arrangement is used, then it is usually advantageous if this arrangement has a collimating or focusing design. In contrast, for the use of a reflector as the secondary optical arrangement, it can be useful with respect to efficiency and functionality of the entire system for the primary optical arrangement to have a scattering design, in order to be able to use the reflector in the best possible way.

A spacing between optoelectronic components, for example the LEDs, and the primary optical arrangement is also usually dependent on what part of the light, for example the light emitted by the LEDs, can be influenced by the primary optical arrangement, especially the lenses, and how the effect on this light is. The spacing can be used to decide whether the light is scattering or collimating. Within one array, the distance can be equal or vary between the optoelectronic components, for example the LEDs, and the lens. For a specified lens size, an acceptance angle, also called Numerical Aperture NA, of the lens is dependent on the spacing to the optoelectronic component, for example LED. Light that is emitted outside of this acceptance angle is scattered and/or diffracted in an uncontrolled way at the edges of the lens or the adjacent lens, so that this is classified as a loss component. For this reason, the spacing between the optoelectronic component, for example the LED, and the surface of the primary optical arrangement can be relevant.

Furthermore, the size of the spatial angle in which the primary optical arrangement and/or the secondary optical arrangement can influence the beam path of the emitted or incident light, for example the light emitted by the LEDs in the half-space, is usually a relevant measure for the efficiency of the optics. To improve this efficiency, usually the available optically effective surface area of the optics should be maximized. One measure that can be implemented according to the invention can consist in that, instead of round basic surfaces that are easy to form and rotationally symmetric horizontal section faces, rectangular or polygonal basic and section surfaces are considered that maximize the use of the available space between adjacent optoelectronic components, for example between adjacent LEDs. For an array having equal pitch in two spatial directions, this corresponds, for example, to a quadratic basic shape. With the maximum utilization of the, for example, quadratic surface area, the optically active area can be maximized, which can result in an increase or even a maximization of the efficiency.

The surface of the primary optical arrangement can be smooth, roughened, or structured in some other way, wherein, in the latter case, for example, the surface can also be provided with Fresnel optics. For a smooth surface, for example, the actual lens effect is usually not affected. For specific shaping, for example collimating, with this surface the greatest efficiency can be achieved in many cases. With a roughened and/or micro-structured structure, an additional scattering effect is usually added to the actual lens effect.

If lenses are used in the optics, for example of the primary optical arrangement, then these can be oriented in different ways to the associated optoelectronic components. Thus, for example, a lens focal point of the primary optical arrangement can be arranged centrally or off center relative to an associated optoelectronic component, for example to an LED. A decentralized arrangement, for example in the micrometer to millimeter range or larger, can here be equal selectively for all lenses or can also change in a sliding manner. By such displacements a light cone formed by the primary optical arrangement can be, for example, tilted. Therefore, for example, a so-called squinting effect for increasing the irradiation strength in the center in front of the LED array can be achieved in that, for example, the light cones of the LEDs at the edge are guided toward the middle through relative displacement. A statistically distributed relative displacement within an LED array, however, can also be used for homogenizing the light.

As discussed above, at least one primary optical arrangement can be combined with at least one secondary optical arrangement. The secondary optical arrangement can comprise, for example, at least one reflector and/or at least one lens, wherein the mentioned elements can be arranged individually or also in an array. Thus, the secondary optical arrangement can comprise, for example, a reflector array and/or a lens array. Even at large distances, for a single use of the primary optical arrangement, only the light of a relatively small range of spatial angles contributes to the illumination. By the secondary optical arrangement the light of an increased range of spatial angles is made usable, wherein the efficiency of the overall system can be increased. Therefore, two effects or a mixed effect from two effects can be achieved. Thus, by the secondary optical arrangement a focusing of the light can be significantly improved. This has the advantage that for a constant number of optoelectronic components, for example for a constant number of LEDs, the maximum irradiation strength can be increased. If the maximum irradiation strength remains at the same level, then the number of optoelectronic components, for example the number of LEDs, can be reduced, because the existing light can be used more efficiently by the secondary optical arrangement.

The primary optical arrangement can also be combined, for example, with at least one reflector and/or at least one additional lens array as a secondary optical arrangement. Therefore, it is usually possible to further transform the field distribution generated by the primary optical arrangement. Thus, it is possible, for example, to achieve improved focusing, in order to increase the maximum irradiation strength.

The secondary optical arrangement can also be designed, depending on the application process, such that this has an effect in one or in two spatial directions. In reality, this is important in the case of a line emitter for a continuous operation process, such that the secondary optical arrangement can be arranged orthogonal to the direction of travel and can be used to increase the dosing power in the direction of travel and to increase the maximum irradiation strength in the target area. For example, the primary optical arrangement can also be designed as a grating for a two-dimensional emitter or as parallel line (reflector) profiles for a line emitter. This can be important so that the structural size of the secondary optical arrangement can also be variably adapted. Here, multiple possibilities can be realized:

a. The primary and secondary optical arrangements have comparable structural sizes.
 b. The structural size of the primary optical arrangement is smaller than that of the secondary optical arrangement.
 c. The structural size of the primary optical arrangement is larger than that of the secondary optical arrangement.

Within the emitter, the ratios of the structural sizes in both spatial directions can be equal or different or can even change along their profile.

To be able to manage different processing areas, carriers, especially substrates, adapted in size can be designed. To keep costs and effort low, however, it is often useful to line up identical substrates, for example having a surface area in the range of 1 cm$^2$ or larger, next to each other. Therefore, a modular construction of the system according to the invention, for example the LED system, is possible, and the optical design can be realized. Several variants also exist, in turn, with regard to this realization. Thus, for example, a series connection of two or more optoelectronic chip-on-board modules can be realized according to the invention in one or two spatial directions. An encapsulation can be realized simultaneously for one, two, or more optoelectronic chip-on-board substrates or chip-on-board modules. The encapsulation can be applied, for example, without lateral projection onto the substrate, for example the carrier, so that a gap-less series connection of substrates is possible.

Furthermore, for example, one or more optoelectronic chip-on-board modules and/or their substrates and/or one or more systems according to the invention can also be arranged on one or more cooling bodies, or an optoelectronic chip-on-board module and/or a system according to the invention can comprise one or more cooling bodies. Thus, for example, one or more chip-on-board substrates having LEDs can be located on a cooling body/substrate. In the encapsulation process, for example, at least one cooling body having one encapsulation body can be provided, so that, for example, all of the substrates located on the body can be encapsulated at the same time. A simultaneous, common encapsulation of several cooling bodies that can function as a module base is also conceivable.

A modularity of the secondary optical arrangement can here correspond, in general, also to a modularity of the optoelectronic components, for example a modularity of the LED arrays, so that, for example, an array of optoelectronic components, for example an LED array, contains a secondary optical arrangement module.

If secondary optical arrangement modules are provided, then these can be larger or even smaller than an array of the optoelectronic components, for example as an LED array, so that, for example, a secondary optical arrangement module can be positioned above two, three, or more arrays of optoelectronic components, for example LED arrays, arranged one next to the other. In the inverse case, for example, two, three, or more secondary optical arrangement modules can be required for each array of optoelectronic components, for example for each LED array.

An optional series connection of optoelectronic chip-on-board modules and/or substrates of these modules, for example, in a system according to the invention, and/or a series connection of secondary optical arrangements can maintain the pitch with respect to the spacing of the optoelectronic components, that is, can be lined up directly, or even non-pitch maintaining, that is, can be lined up with intermediate spacing.

Within an optoelectronic chip-on-board module or a system, for example within an LED emitter, differently shaped secondary optical arrangements can be used. Thus, for example, at the edge of an optoelectronic chip-on-board module, in particular at the edge of an LED emitter, reflectors can be used that reflect the light, for example at an angle to a center in front of the emitter, for example similar to the "squinting" primary optical arrangement described above. Here, the central reflectors can also reflect the light to the center in front of the emitter.

Furthermore, depending on the position, different secondary optical arrangements can be used, for example at least one reflector, at least one lens, or at least one combination of at least one reflector of at least one lens. Alternatively, secondary optical arrangements could also be completely eliminated depending on the position.

Overall, optoelectronic chip-on-board modules can be realized according to the invention that advantageously have at least one primary optical arrangement that has, for example, only one discharge side. Reflection losses on one input side can also be avoided in this way. Furthermore, shaping can be performed, for example the use of an optical shape for a lens to reduce reflection losses. For each individual optoelectronic component, for example for each individual LED, beam shaping adapted to the specific requirements can be generated. Through the possibility of spatial proximity of the optics to the optoelectronic components, for example the lenses to the LEDs, the light of a large range of spatial angles is usable.

Furthermore, the optoelectronic components, for example the LEDs, could have a protective, transparent, UV-resistant, and temperature-resistant encapsulation. In this way, in particular, long-term stability can also improve and new fields of use can be opened up due to increased tightness relative to moisture and other environmental effects.

Due to the ability of a variably adjustable spacing between the optoelectronic components, for example between the LEDs, in one or two spatial directions, the available light power can be further adapted exactly to the corresponding requirements. For example, many LEDs can be arranged in a tight space or relatively fewer LEDs can be arranged in order to generate space for a certain optical arrangement.

Due to the different possible structural sizes of the elements of the primary optical arrangement, for example the lenses of the primary optical arrangement, the existing light power can be used efficiently. Thus, a lens function of the primary optical arrangement can be, for example, scattering, collimating, or focusing, depending on the requirements. The surface of the primary optical arrangement can be, for example, smooth, roughened, or structured in some other way, depending on requirements.

Due to the possibility to displace the elements of the primary optical arrangement relative to the allocated optoelectronic components, for example due to a displacement of the lens of the primary optical arrangement relative to the LED, a light cone can be inclined (squinting) as described above.

Through the use of one or more optional secondary optical arrangements, the efficiency of the optoelectronic chip-on-board module and/or the efficiency of the system can be significantly increased. In particular, this arrangement can realize a "recycling" of divergent light. Therefore, for example, higher irradiation strengths can be achieved, and/or optoelectronic components, especially LEDs, can be spared.

Another advantage of the present invention consists in the possibility of a realization of high modularity. Thus, for example, optoelectronic chip-on-board modules can each be realized having one or more one-dimensional or two-dimensional arrays of optoelectronic components, wherein these arrays can have identical constructions. Several such optoelectronic chip-on-board modules, especially having identical arrays of optoelectronic components, can be connected in series to each other in one or two spatial directions. The identity of the arrays of optoelectronic components, for example the LED arrays, can be advantageous for a simple and cost-efficient production sequence. Overall, advantages with regard to an adaption to different processing geometries can be realized in this way.

These individual advantages that can be realized according to the invention or also combinations of these advantages can cause a direct increase in the efficiency of the optoelectronic chip-on-board module and/or the system, for example the emitter. In this way, for example, very high irradiation strengths can be achieved for simultaneously homogeneous irradiation strength distributions, even with large distances. The listed advantages can also be combined with each other in pairs or in groups arbitrarily. The spectrum of possibilities that can be realized is therefore high, wherein a plurality of requirements can be fulfilled.

BRIEF DESCRIPTION OF THE SEVERAL VIEWS OF THE DRAWINGS

The foregoing summary, as well as the following detailed description of the invention, will be better understood when read in conjunction with the appended drawings. For the purpose of illustrating the invention, there are shown in the drawings embodiments which are presently preferred. It should be understood, however, that the invention is not limited to the precise arrangements and instrumentalities shown. In the drawings:

FIG. 9 is a schematic representation of another embodiment of a chip-on-board module according to the invention having a primary optical arrangement having multiple lenses for each optoelectronic component;

FIGS. 10A and 10B are schematic representations of embodiments of chip-on-board modules according to the invention having an oriented primary optical arrangement (FIG. 10A) and a primary optical arrangement in an offset arrangement (FIG. 10B);

In the figures, identical or similar elements or corresponding parts are provided having the same reference symbols, so that corresponding repeated descriptions are omitted in the following.

DETAILED DESCRIPTION OF THE INVENTION

The invention is explained with reference to chip-on-board LED modules, that is light-emitting bodies, as an example for optoelectronic chip-on-board modules. Within the scope of the invention photodiodes in solar cells or other components could be used as the optoelectronic components instead of LED modules.

Figure 1:
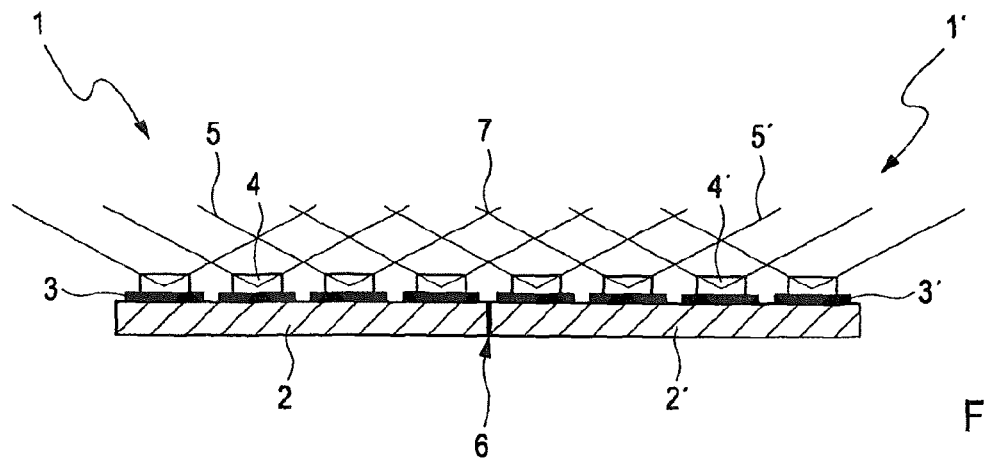
FIG. 1 is a schematic illustration of two chip-on-board LED modules.

FIG. 1 shows schematically in cross section a chip-on-board LED module 1 without coating, in which strip conductors 3, 3' and LEDs 4, 4' formed as non-housed LED chips are arranged in regular spacing on two parallel substrates 2, 2' or carriers. For reasons of clarity, not all recurring elements of FIG. 1 and the following figures are provided with reference symbols, but these all refer to identical elements. Thus, in FIG. 1 only one LED 4, 4' is designated for each of the two chip-on-board LED modules 1, 1' with a reference symbol. The other components are identical.

A substrate 2, 2' can be, for example, a metal, ceramic, or silicon substrate built using rigid, semi-flexible, or flexible substrate technology, a metal core or FR4 circuit board, a glass substrate, or a plastic substrate.

The light cones 5, 5' of the LEDs 4, 4' are shown with lines. The LEDs are approximately Lambert emitters that emit approximately 75% of the total emitted light power within an opening angle of 120°. If the surface area populated with LEDs 4, 4' expands relative to the measured distance and the distance is sufficiently larger than the spacing of the LED chips, also called "pitch," then a homogeneous intensity distribution having similar properties is measured as that of a homogeneous, diffuse illuminating surface.

In the case shown in FIG. 1, the homogeneous intensity distribution also continues beyond the joint 6 between adjacent modules 1, 1', because the overlapping area 7 of the light cones 5, 5' is well shaped at this point due to the regular and edge continuous population of LEDs 4, 4' on the substrates 2, 2' and the lack of optical obstacles.

Figure 2:
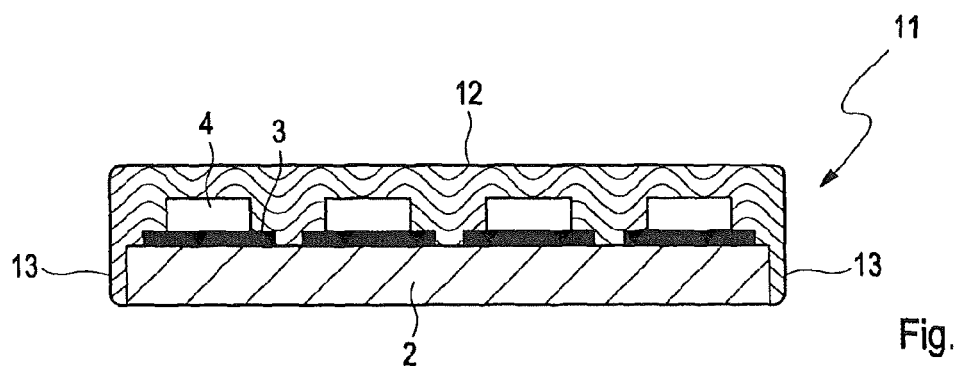
FIG. 2 is a schematic representation of a chip-on-board LED module according to an embodiment of the invention.

FIG. 2 shows schematically a chip-on-board LED module 11 according to an embodiment of the invention that also has strip conductors 3 and LED chips 4 on a substrate 2. It is provided with a silicone coating 12 that also projects beyond the side edges of the substrate 2 in the edge areas 13 and thus protects the substrate 2 all around.

The chip-on-board LED modules 2 of the invention embodiment according to FIG. 2 can be arranged aligned one next to the other, so that a uniform, overlapping radiation area can be achieved with radiation characteristics as shown in FIG. 1.

Figure 3:
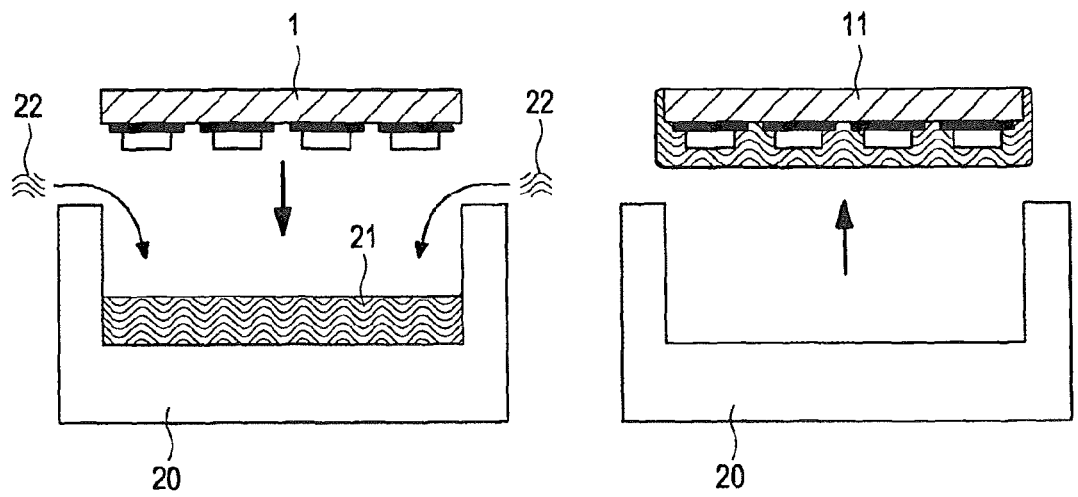
FIGS. 3a and 3b are schematic representations illustrating steps of the method according to an embodiment of the invention.

FIG. 3a and FIG. 3b schematically represent how the chip-on-board LED module 11 of the invention embodiment according to FIG. 2 is produced. For this purpose, initially an uncoated chip-on-board LED module 1 is immersed headfirst into a mold 20 having a bath made of liquid silicone 21 that had been filled into the mold from one or more silicone supplies 22. The immersion takes place in the direction of the arrow shown in the center in FIG. 3a.

The filling height of the silicone is selected such that with its surface, the substrate 2 contacts the surface of the silicone or is immersed slightly therein. For this purpose, the dimensions or the open inner dimension of the mold are selected such that the substrate 2 of the chip-on-board module 1 is received completely within the mold. Between the side walls of the mold 20 and the outer side of the substrate 2 there is possibly a small gap into which silicone 21 can penetrate.

The liquid silicone 21 is then cured and here cross-linked with the module, for example thermally. When the silicone is completely cured, the substrate is removed from the mold as a newly coated chip-on-board LED module 11 including the now cured, bonded, and transparent encapsulation. This is represented in FIG. 3b with the arrow shown in the center there.

Figure 4:
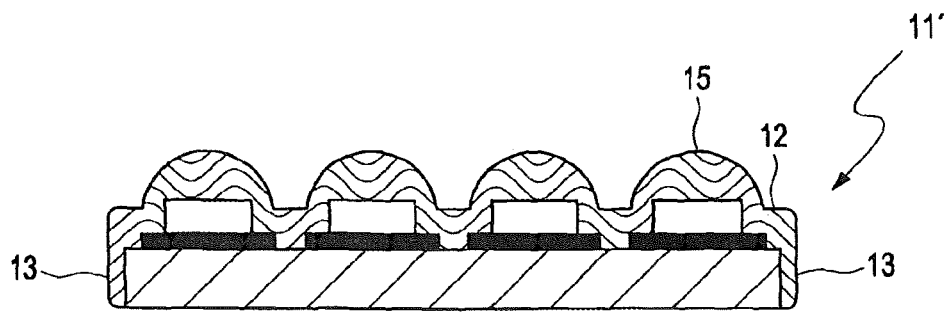
FIG. 4 is a schematic representation of another embodiment of a chip-on-board LED module according to the invention.
Figure 5:
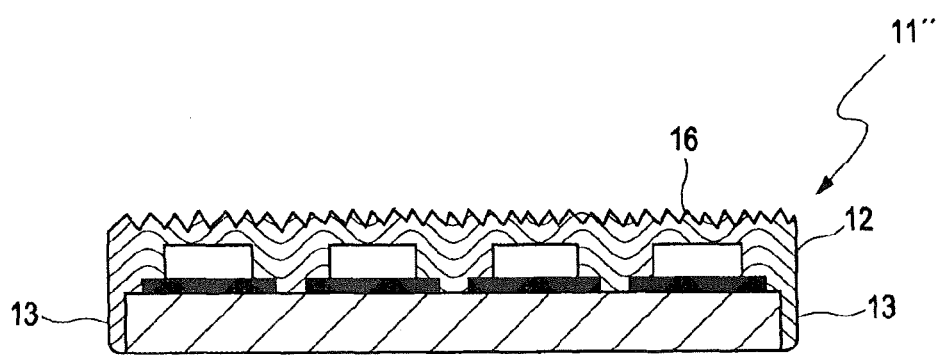
FIG. 5 is a schematic representation of another embodiment of a chip-on-board LED module according to the invention.
Figure 6:
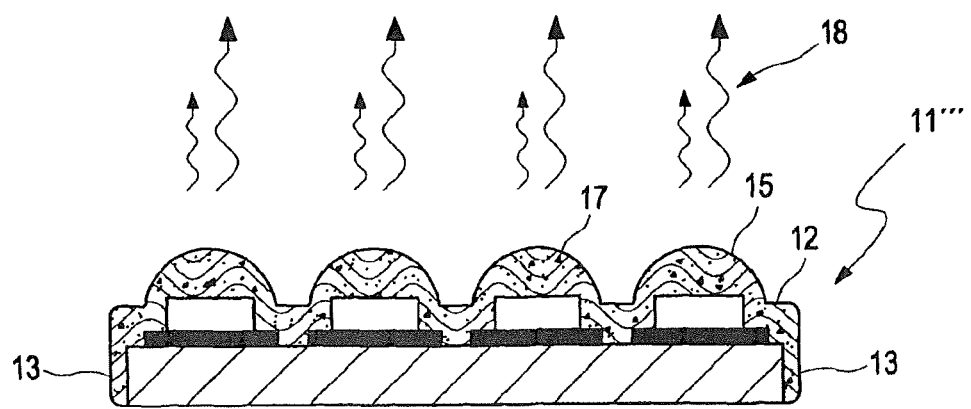
FIG. 6 is a schematic representation of another embodiment of a chip-on-board LED module according to the invention.
Figure 7:
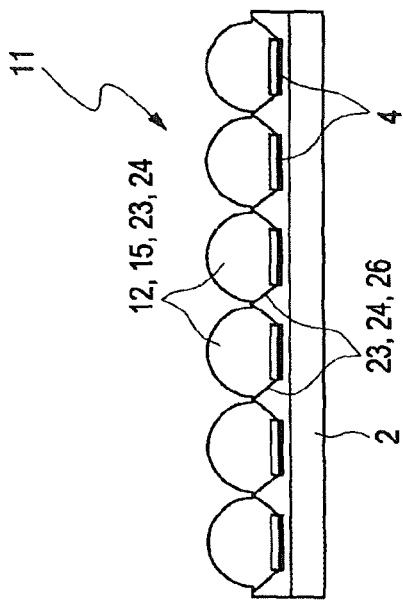
FIGS. 7A and 7B are schematic representations of further embodiments of chip-on-board modules according to the invention having different primary optical arrangements.
Figure 8:
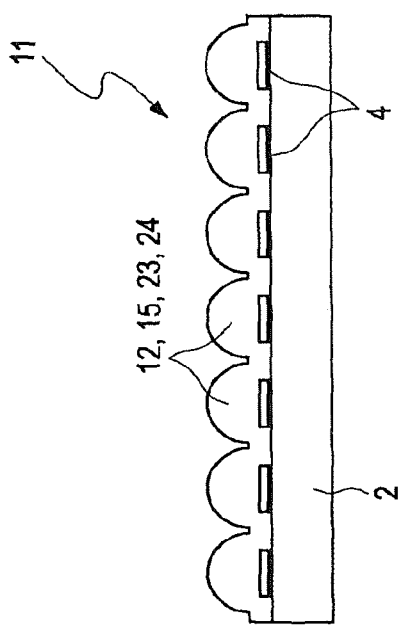
FIGS. 8A and 8B are schematic representations of additional embodiments of chip-on-board modules that can be realized according to the invention having different types of primary optical arrangements for multiple optoelectronic components.
Figure 7:
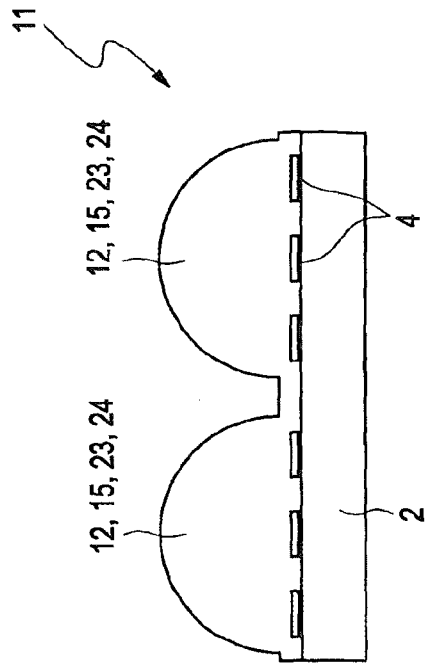
Figure 8:
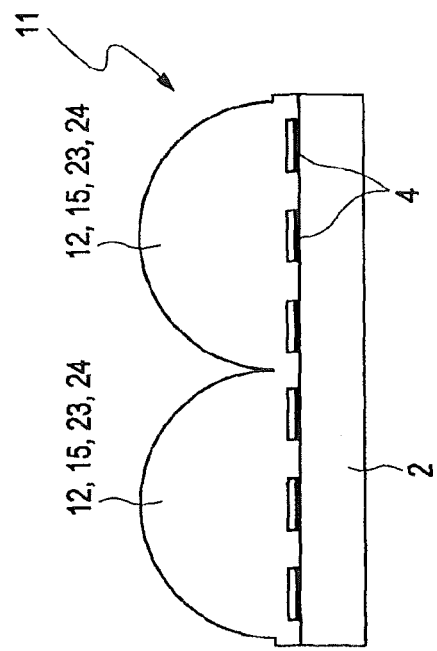

FIGS. 4, 5, and 6 represent three different variants of optoelectronic chip-on-board modules 11', 11", 11'" according to the invention, which do not differ in the components of the substrate, the strip conductor, and the LEDs from the chip-on-board LED module 11 of FIG. 2.

In FIG. 4 the surface of the coating 12 has a surface structure in the form of lenses, especially micro-lenses, made of silicone above the individual LEDs, with this surface structure resulting from an inverse shaping of the structure of the mold into which the silicone had initially been inserted. These lenses have a focusing or dispersing effect on the light emitted by the LEDs, depending on the geometry used.

The structure shown in FIG. 4 can also be used by photovoltaic modules, in order to focus incoming light onto the corresponding photodiodes.

In FIG. 5 with the optoelectronic chip-on-board LED module 11", the surface is changed so that a roughened surface structure 16 is produced. In this way, the light emitted by the LEDs is scattered in different directions and the light distribution is homogenized overall.

In FIG. 6 with a chip-on-board LED module 11'" according to the invention, a surface structure of the coating 12 is introduced that corresponds to that of FIG. 4 having individual lenses 15 over the LED chips. In addition, the silicone material is mixed with phosphorescing material 17, which causes a wavelength shift of the transmitted light or a portion of the transmitted light, which is represented above the lenses 15 by the arrows having wavy tails having different wavelengths. These arrows symbolize photons of different wavelengths and thus different colors. For example, the arrows having small wavy tails correspond to photons from the ultraviolet range, while the arrows having larger tails can correspond to photons in the visible range.

FIGS. 7A to 15C represent other different constructions of chip-on-board modules according to the invention, which are designated in these figures with the reference symbol 11, without limiting other possible constructions. For the construction and the production of these chip-on-board modules 11, the above description can be referenced as an example.

Thus, the chip-on-board modules 11 can have, as described above, one or more optical arrangements, which are designated below in general with the reference symbol 23. The lenses 15 mentioned above represent examples of such optical arrangements 23. As an alternative or in addition to lenses, however, other optical arrangements could also be used, for example reflectors. Here, a distinction is made below in general between a primary optical arrangement 24 and a secondary optical arrangement 25. As mentioned above, a primary optical arrangement 24 is understood to be an optical element that is placed on a light path adjacent to the optoelectronic components, for example the LEDs 4 in the illustrated embodiments, so that between the primary optical arrangement 24 and the optoelectronic components, especially the LEDs 4, there are no additional optical components having dispersive, focusing, or collimating properties. In contrast, a secondary optical arrangement 25 is understood to be an optical component that is arranged relative to the optoelectronic components, here the LEDs 4, such that at least one additional optoelectronic element having dispersive, focusing, or collimating properties is arranged on the light path between these elements and the optoelectronic components. Here, the primary optical arrangement 24 and/or the secondary optical arrangement 25 can be shaped according to the invention by the method according to the invention. The primary optical arrangement 24 and/or the secondary optical arrangement 25 can each comprise one or more optical components, for example lenses and/or reflectors.

FIGS. 7A and 7B show embodiments of optoelectronic chip-on-board modules 11 that each comprise only primary optical arrangements 24. Here, FIG. 7A shows an embodiment in which, in an array of LEDs 4, a lens 15 is allocated to each LED. The LEDs 4 and the associated lenses 15 of the primary optical arrangement 24 here have comparable structural sizes.

In contrast, FIG. 7B shows an embodiment in which the primary optical arrangement 24 comprises, in addition to lenses 15, reflectors 26. For example, these reflectors 26 could be constructed as micro-reflectors. The reflectors 26 could be constructed, for example, as recesses, for example as recesses in the substrate 2, wherein the surfaces of these recesses can have reflective properties. In turn, a structural size of the reflectors 26 and/or the lenses 15 in the embodiment represented in FIG. 7B could be comparable, for example, with the size of the chips of the LEDs 4.

FIGS. 8A and 8B show additional embodiments of optoelectronic chip-on-board modules 11 that each have a primary optical arrangement 24. In this embodiment, each primary optical arrangement 24 has, in turn, lens 15, analogous to the embodiment according to FIG. 7A. Here, however, each lens 15 is allocated to several LEDs 4. The structural size of the LEDs 4 is thus smaller than the structural size of the allocated lens 15 of the primary optical arrangement 24. Here, FIG. 8A shows an embodiment having constant pitch (distance between the centers of adjacent LEDs 4), that is, a so-called pitch-maintaining variant, and FIG. 8B shows an embodiment in which there are different pitches, that is, a pitch-varying variant.

FIG. 9 shows, in turn, a modification of the embodiment according to FIG. 7A. In turn, a primary optical arrangement 24 is provided that comprises a plurality of lenses 15. In the illustrated embodiment, however, a plurality of lenses 15 is allocated to each LED 4. The structural size of the LEDs 4 is thus larger than the structural size of the lenses 15 of the primary optical arrangement 24.

FIGS. 10A and 10B show different embodiments of optoelectronic chip-on-board modules 11 or of sections of such chip-on-board modules 11, which differ with respect to an arrangement of the primary optical arrangement 24 relative to the LEDs 4. Otherwise, the embodiments can basically correspond, for example, to the embodiment according to FIG. 7A.

Thus, FIG. 10A shows an embodiment in which an optical axis 27 of a lens 15 and an optical axis 28 of a LED 4 coincide, so that, in a top view of the chip-on-board module 11, a center point of the lens and a center point of the LED 4 can lie one above the other. In contrast, FIG. 10B shows an embodiment in which the optical axis 27 of the lens and the optical axis 28 of the LED 4 are shifted relative to each other. A different configuration is also possible, for example a tilted configuration of the axes 27, 28.

Figure 11:
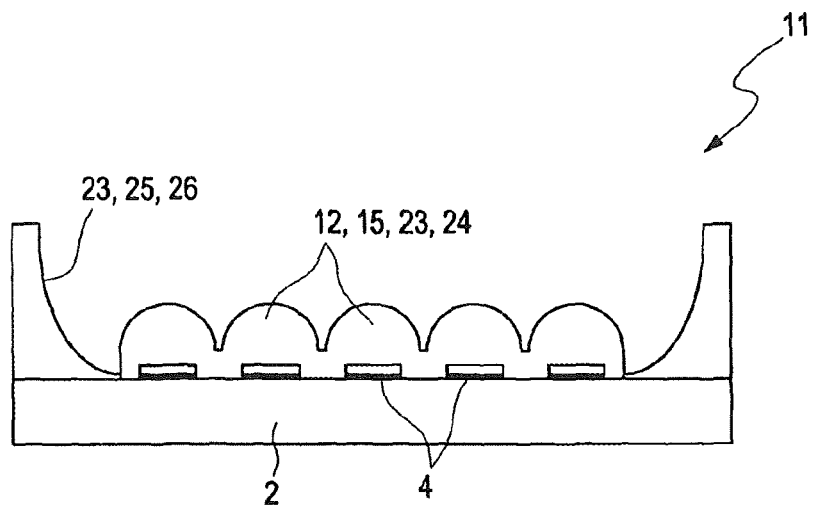
FIG. 11 is a schematic representation of an embodiment of a chip-on-board module that can be realized according to the invention having a primary optical arrangement and a secondary optical arrangement.

FIG. 11 shows an embodiment in which the optics 23 have, in addition to a primary optical arrangement 24, also a secondary optical arrangement 25. This secondary optical arrangement 25 can comprise, in turn, one or more lenses or, as shown in FIG. 11, one or more reflectors 26. For example, the embodiment according to one or more of FIGS. 7A to 10B can be combined with one or more reflectors. Here, one or more of the elements of the secondary optical arrangement 25 can be allocated to one, several, or all of the LEDs 4.

Figure 12:
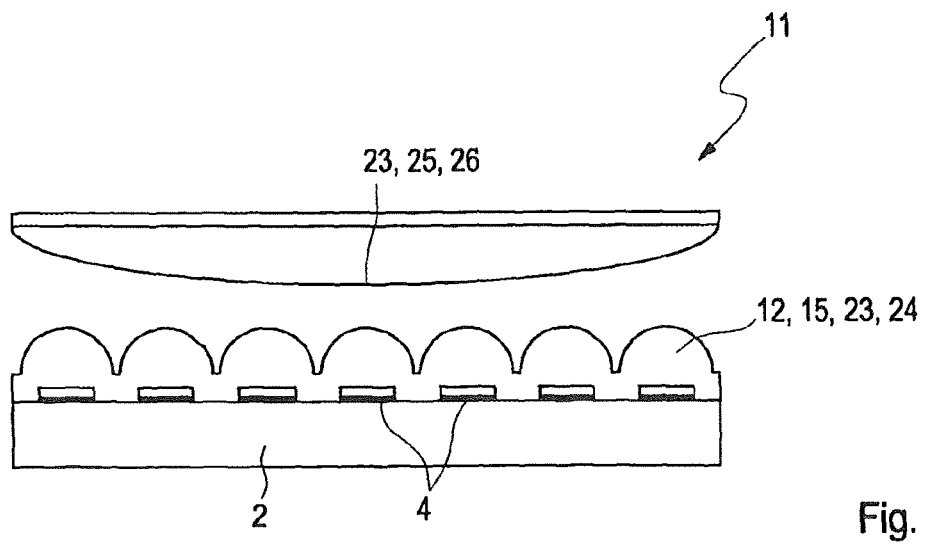
FIG. 12 is a schematic representation of an alternative embodiment to FIG. 11 having a primary optical arrangement and a secondary optical arrangement.

FIG. 12 shows a modification of the embodiment according to FIG. 11. Instead of a reflector, as shown in FIG. 11, this embodiment shows that the secondary optical arrangement can also comprise one or more lenses alternatively or additionally.

Figure 13:
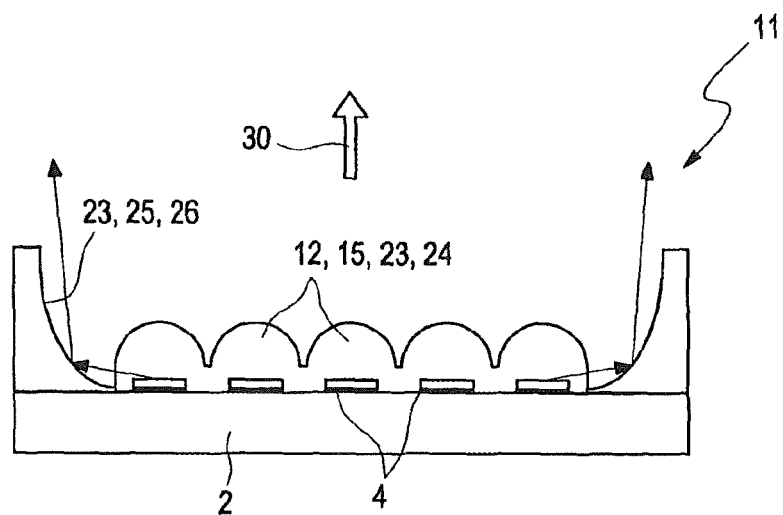
FIG. 13 is a schematic representation of the light path in the embodiment according to FIG. 11.

FIG. 13 shows, as an example, a beam path inside the embodiment according to FIG. 11. Light emerging from an LED 4 first passes the curved surface of the lens 15 allocated to this LED 4 in the primary optical arrangement 24, where refraction takes place, so that this surface acts as the actual optical element of the primary optical arrangement 24. Then, the light emerging from the primary optical arrangement 24 is partially refracted and/or focused and/or collimated at the secondary optical arrangement 25. In the shown embodiment, in which an exemplary beam path is shown, the rays emerging through the primary optical arrangement 24 are reflected at the surfaces of the reflectors 26 of the secondary optical arrangement 25 in the direction of an emission direction 30, so that a usable range of spatial angles can be increased.

Figure 14:
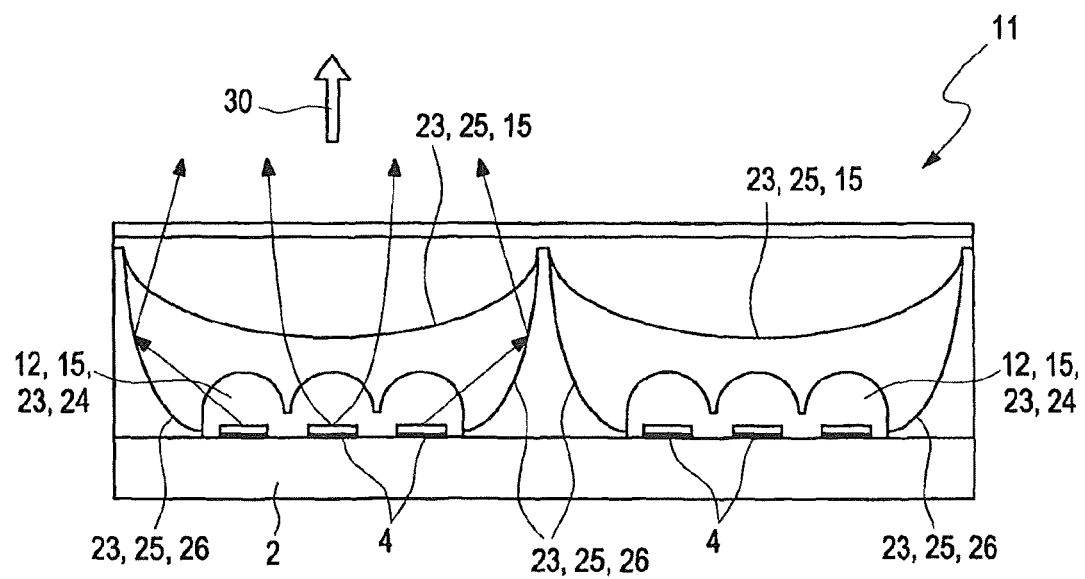
FIG. 14 is a schematic representation of an embodiment of a chip-on-board module according to the invention having multiple secondary optical arrangements.
Figure 15:
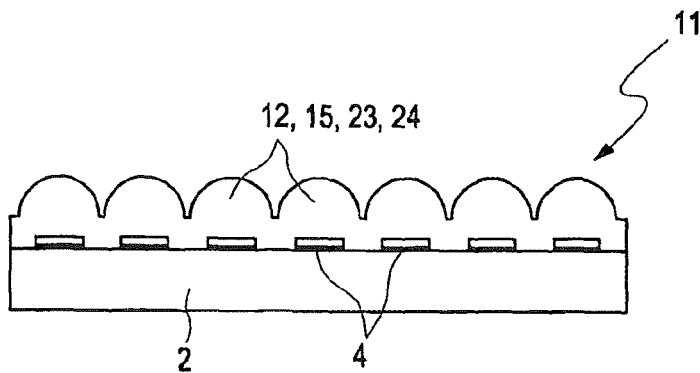
FIGS. 15A to 15C are schematic representations of different configurations of optoelectronic modules according to the invention having different surface structures.
Figure 15:
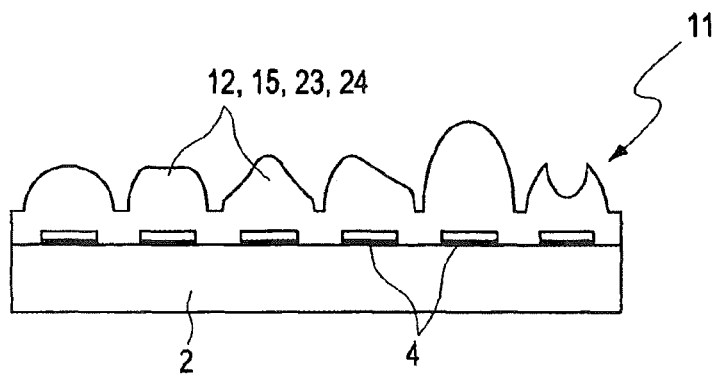
Figure 15:
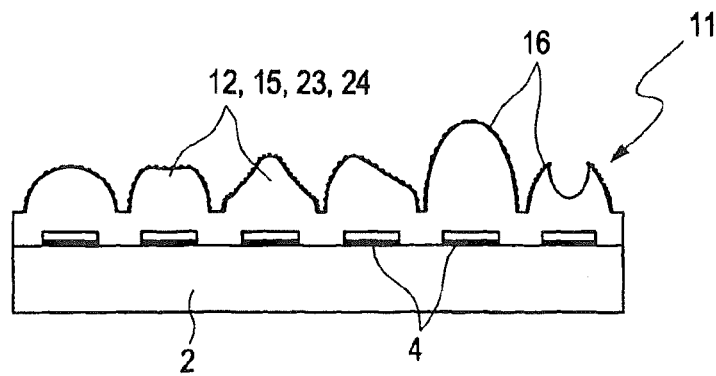

FIG. 14 shows an embodiment that includes, in turn, a combination of at least one primary optical arrangement 24 and at least one secondary optical arrangement 25. In this embodiment, however, the secondary optical arrangement 25 contains several elements, namely at least one reflector 26 and at least one lens 15. While a lens 15 is allocated to each LED 4 in the primary optical arrangement 24, this embodiment shows as an example that a common secondary optical arrangement 25, for example a common reflector 26 and/or a common lens 15, can be allocated to a group of LEDs, in this case 3 LEDs or more LEDs. Different beam paths are indicated, in turn, as examples. In this way, multiple units can be arranged in series with a common secondary optical arrangement 25 in one or two spatial directions, as also shown as an example in FIG. 14.

FIGS. 15A and 15C show different embodiments, which show the different possibilities for realizing a surface of the optics 23, especially the silicone coating 12. The embodiments show examples for realizing a surface structure of the primary optical arrangement 24. Alternatively or additionally, however, surface structures of one or more optional secondary optical arrangements 25 can also be formed with the method according to the invention.

Thus, FIG. 15A represents an embodiment, which can correspond essentially to the embodiment according to FIG. 7A. In this case, a smooth surface structure of the lenses 15 is provided. The lenses 15 can have spherical optics.

While in the embodiment according to FIG. 15A, as an example, identical elements of the primary optical arrangement 24, especially identical lenses are represented, the elements of the optics 23 within the optoelectronic module 11 can also vary. This is shown as an example in FIG. 15B. In this embodiment, the optics 23 comprise a plurality of optical elements, in this case a plurality of lenses that have different optical properties.

Finally, in FIG. 15C it is shown that the roughened surface structure 16 shown in FIG. 5 can also be combined with one or more optical arrangements 23. As an example, this is shown in the illustrated embodiment for a plurality of lenses 15, which are here to be allocated, as an example, to the primary optical arrangement 24, and which are here formed, as an example, analogous to the embodiment according to FIG. 15B. Other configurations are also, however, basically possible, for example a roughened surface structure 16 in the embodiment according to FIG. 15A. Alternatively or additionally to a roughened surface structure 16, other surface structures can also be used, for example surface structures in the form of Fresnel lenses.

All of the mentioned features, even the features to be inferred just from the drawings alone, as well as individual features that are disclosed in combination with other features, are considered important to the invention alone and in combination. Embodiments according to the invention can be fulfilled by individual features or a combination of multiple features.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

We claim:

1. An optoelectronic chip-on-board module comprising;
a flat substrate having a surface populated with an array of optoelectronic components; and
a transparent, UV-resistant, and temperature-resistant coating made of a silicone,
wherein in a completed configuration of the module after all steps for producing the module have been completed, the surface of the substrate populated with the array of optoelectronic components is coated with the silicone without a margin and first and second lateral surfaces of the substrate are entirely coated with the silicone, such that the coating forms a lens array that entirely covers the array of optoelectronic components with one lens covering each optoelectronic component.

2. The optoelectronic chip-on-board module according to claim 1, wherein the silicone includes a mixture of optically functional materials selected from phosphorescing and dispersing materials or particles.

3. The optoelectronic chip-on-board module according to claim 1, wherein the module has at least one primary optical arrangement adjacent to the at least one optoelectronic component and optionally has at least one secondary optical arrangement, and wherein at least one of the optical arrangements is formed at least partially in the coating.

4. The optoelectronic chip-on-board module according to claim 1, wherein the substrate is populated with the array of optoelectronic components up to or up to shortly before at least one edge of the substrate.

5. A system comprising at least two optoelectronic chip-on-board modules according to claim 1, wherein the substrates of the optoelectronic chip-on-board modules arranged adjacent to each other are flush or have a defined spacing relative to each other, and wherein the substrates are populated with optoelectronic components up to edges of the substrates, such that a regular arrangement and spacing of optoelectronic components is produced even beyond the edges of the adjacent substrates.

* * * * *